(12) United States Patent
Rossi

(10) Patent No.: US 6,521,541 B2
(45) Date of Patent: Feb. 18, 2003

(54) SURFACE PREPARATION OF SUBSTANCES FOR CONTINUOUS CONVECTIVE ASSEMBLY OF FINE PARTICLES

(75) Inventor: Robert Rossi, Rochester, MN (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/922,519

(22) Filed: Aug. 3, 2001

(65) Prior Publication Data

US 2002/0023894 A1 Feb. 28, 2002

Related U.S. Application Data

(60) Provisional application No. 60/227,401, filed on Aug. 23, 2000.

(51) Int. Cl.[7] ............................................. H01L 21/302
(52) U.S. Cl. ........................ 438/710; 438/706; 427/282
(58) Field of Search ................................. 438/710, 706; 427/282, 123; 117/68, 72

(56) References Cited

U.S. PATENT DOCUMENTS

| | | | | |
|---|---|---|---|---|
| 4,315,958 A | * | 2/1982 | Peiffer et al. ................ | 376/151 |
| 4,407,695 A | * | 10/1983 | Deckman et al. ...... | 204/192.34 |
| 4,701,366 A | * | 10/1987 | Deckman et al. .............. | 216/66 |
| 4,801,476 A | * | 1/1989 | Dunsmuir et al. ........... | 118/402 |
| 5,437,892 A | * | 8/1995 | Nagayama et al. .......... | 427/282 |
| 5,505,996 A | * | 4/1996 | Nagayama ................... | 427/123 |
| 5,540,951 A | * | 7/1996 | Nagayama et al. ....... | 427/372.2 |
| 5,753,130 A | * | 5/1998 | Cathey et al. ................. | 216/11 |
| 5,968,642 A | * | 10/1999 | Saito ........................... | 427/180 |
| 6,017,390 A | * | 1/2000 | Charych et al. ............... | 117/68 |
| 6,019,658 A | * | 2/2000 | Ludwig et al. ................ | 445/24 |
| 6,207,578 B1 | * | 3/2001 | Yang et al. .................. | 438/706 |
| 6,355,429 B1 | * | 3/2002 | Nygren et al. ............... | 356/364 |

* cited by examiner

Primary Examiner—John F. Niebling
Assistant Examiner—Olivia Luk
(74) Attorney, Agent, or Firm—Fish & Richardson P.C.

(57) ABSTRACT

A method for producing periodic nanometer-scale arrays of metal or semiconductor junctions on a clean semiconductor substrate surface is provided comprising the steps of: etching the substrate surface to make it hydrophilic, forming, under an inert atmosphere, a crystalline colloid layer on the substrate surface, depositing a metal or semiconductor material through the colloid layer onto the surface of the substrate, and removing the colloid from the substrate surface. The colloid layer is grown on the clean semiconductor surface by withdrawing the semiconductor substrate from a sol of colloid particles.

27 Claims, 6 Drawing Sheets

SURFACE PREPARATION OF SUBSTANCES FOR CONTINUOUS CONVECTIVE ASSEMBLY OF FINE PARTICLES

CROSS-REFERENCE TO RELATED APPLICATIONS

This application claims the benefit of the filing date of U.S. provisional application No. 60/227,401 filed Aug. 23, 2000, the content of which is herein incorporated by reference in its entirety.

STATEMENT REGARDING FEDERALLY SPONSORED RESEARCH OR DEVELOPMENT

This invention was made with Government support under grant no. DE-FG03-88ER13932 awarded by the Department of Energy. The government may have certain rights in this invention.

FIELD OF THE INVENTION

The present invention relates to methods for forming ordered nanometer-scale arrays of metal or semiconductor junctions on a semiconductor surface by means of "natural lithography".

BACKGROUND AND SUMMARY OF THE INVENTION

Decreasing size is the current trend in electronic device fabrication. The present invention provides devices with nanometer-scale features and methods of producing these features that are more efficient and less costly than other techniques. The production of massively parallel arrays of metal-semiconductor and semiconductor-semiconductor junctions is potentially of use in a variety of electronic devices, including, but not limited to, diodes, solar energy collectors, quantum dot structures, substrates for surface enhanced Raman spectroscopy, ultramicroelectrodes, and computer memory.

Producing well-defined nanostructures smaller than about 100 nm may require the development of techniques beyond optical lithography. Although conventional beam lithography techniques are capable of such resolution, they often rely on an electron or ion beam rastered over a surface to create features in the lithographic mask. Metal is then deposited through the mask features onto the substrate surface. The use of a beam to fabricate a mask requires expensive equipment and has a low throughput, since features are often be formed one at a time (i.e., in a serial fashion).

"Natural lithography" refers to a technique in which a crystalline colloid mono- or bilayer is assembled on the surface of a substrate to form a lithographic mask. A second material is deposited through the spaces between the assembled colloidal particles onto the surface of the substrate. The size and geometry of the features created is dependent on the size and arrangement of the colloid particles.

Natural lithography has been employed in the past to form structures on glass surfaces, mica, or on silicon surfaces having a significant oxide layer (i.e., a layer that is at least about 30 Å thick). Due to the importance of wetting the surface on which the lithographic mask is to be formed, many of these demonstrations of natural lithography have employed surfactants and other wetting agents that leave chemical residues on the substrate. Additionally, another common method of forming a colloidal mask, spin-coating, yields colloidal formations that have small regions of crystallinity interspersed with large regions of disorder. Spin-coating has therefore not thus far proven useful for forming macroscopically large regular arrays of features on surfaces.

The fabrication of electronic devices such as semiconductor diodes requires a clean silicon surface that is essentially free of oxide (i.e., it contains a layer of oxide that is less than 30 Å thick) and that is also free of chemical residue from surfactants or other wetting agents. The present invention provides, among other advantages, a method of forming large ordered arrays of nanoscale features on a clean semiconductor surface without leaving undesirable chemical residues in the resulting product. The method is capable of producing arrays covering many square mm or more of the substrate's surface. In addition, the present invention allows formation of features that are much smaller than those possible via optical lithography and is appreciably more efficient than beam techniques, since the lithographic mask is produced in a parallel rather than a serial process.

The method of the present invention for forming a periodic array of nanoscale features on a semiconductor surface includes etching the semiconductor surface to render the surface hydrophilic. Forming a crystalline colloid mono- or bilayer on the etched surface, and depositing a material through the colloid layer onto the substrate surface. The material to be deposited can be any suitable material including, for example, a semiconductor or a metal. The crystalline colloid layer is formed by withdrawing the substrate from a sol of the colloid particles. Preferably, the formation of the crystalline colloid layer is accomplished in an inert atmosphere. After the deposition of the material, the colloid layer is removed.

For a more complete understanding of the invention, its objects and advantages, reference may be had to the following specification and to the accompanying drawings.

DETAILED DESCRIPTION

The present invention provides a method for forming a periodic array of nanoscale junctions. The method uses a natural lithographic mask for producing arrays of metal or semiconductor features on a semiconductor substrate surface. Advantageously, the present invention allows the formation of macroscopically large (i.e., on the order of several mm² or larger) regular arrays in an efficient parallel fashion. In addition, the resulting modified semiconductor surface remains clear of chemical residues and is usable in electronic devices.

Figure 1A:
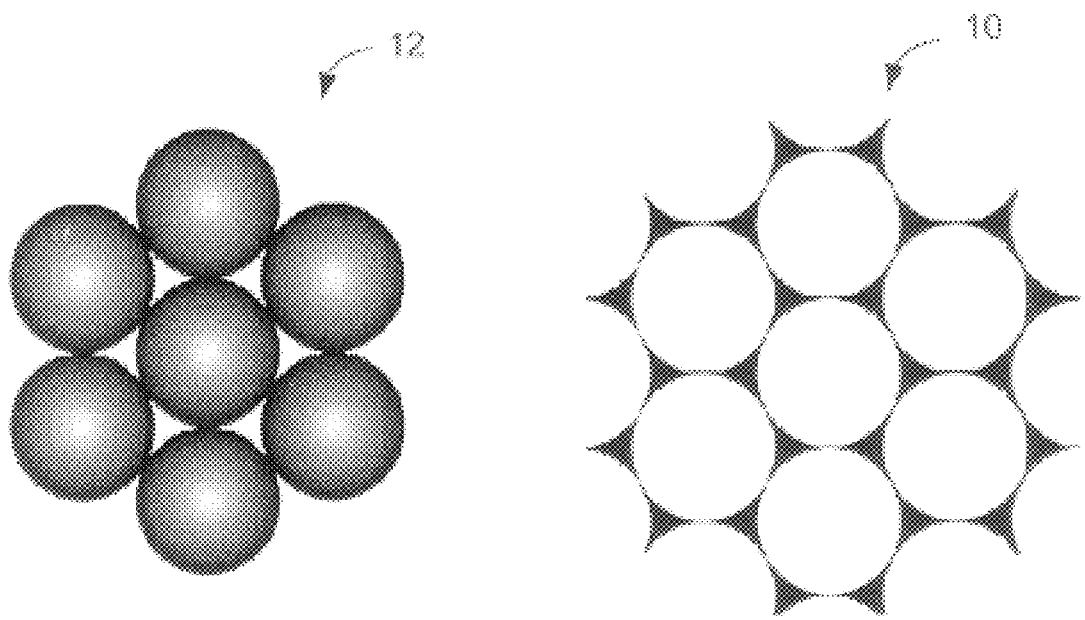
FIG. 1A is a diagram of the geometry of features produced as a result of using a crystalline colloid monolayer as a lithographic mask.

FIG. 1A is a diagram of the geometry of features of a nanopattern 10 produced as a result of using one embodiment of a monolayer lithographic mask 12. The width of the feature produced on the silicon surface is about 0.2 times the diameter of the colloid particle used.

Figure 1B:
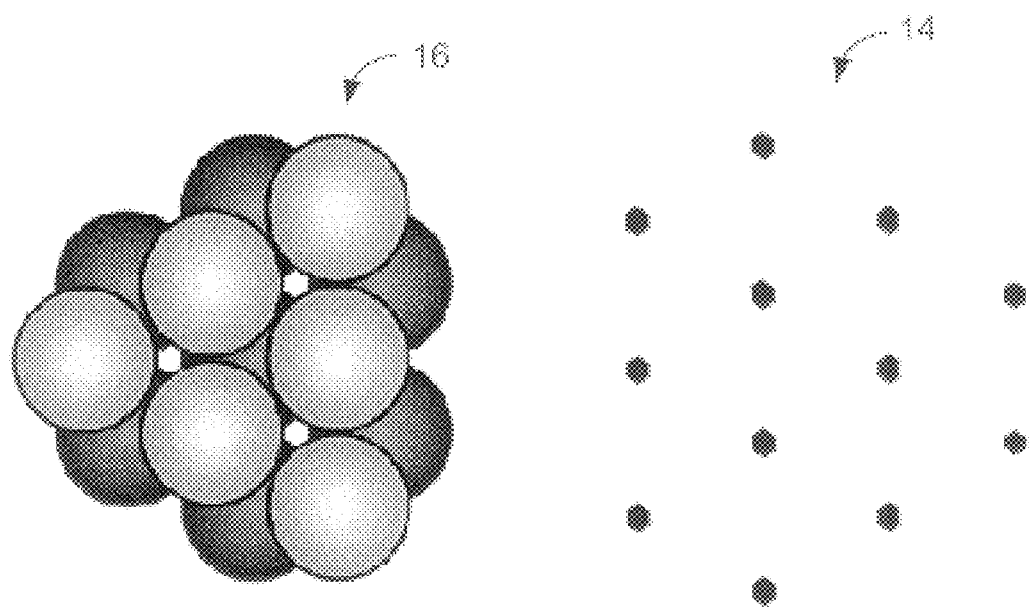
FIG. 1B is a diagram of the features produced by a lithographic mask that is a crystalline colloid bilayer.

FIG. 1B is a diagram of the features of a nanopattern 14 produced by an embodiment of a lithographic mask 16 that is a bilayer. The width of the feature produced on the silicon surface is about 0.16 times the diameter of the colloid particle used.

Figure 2:
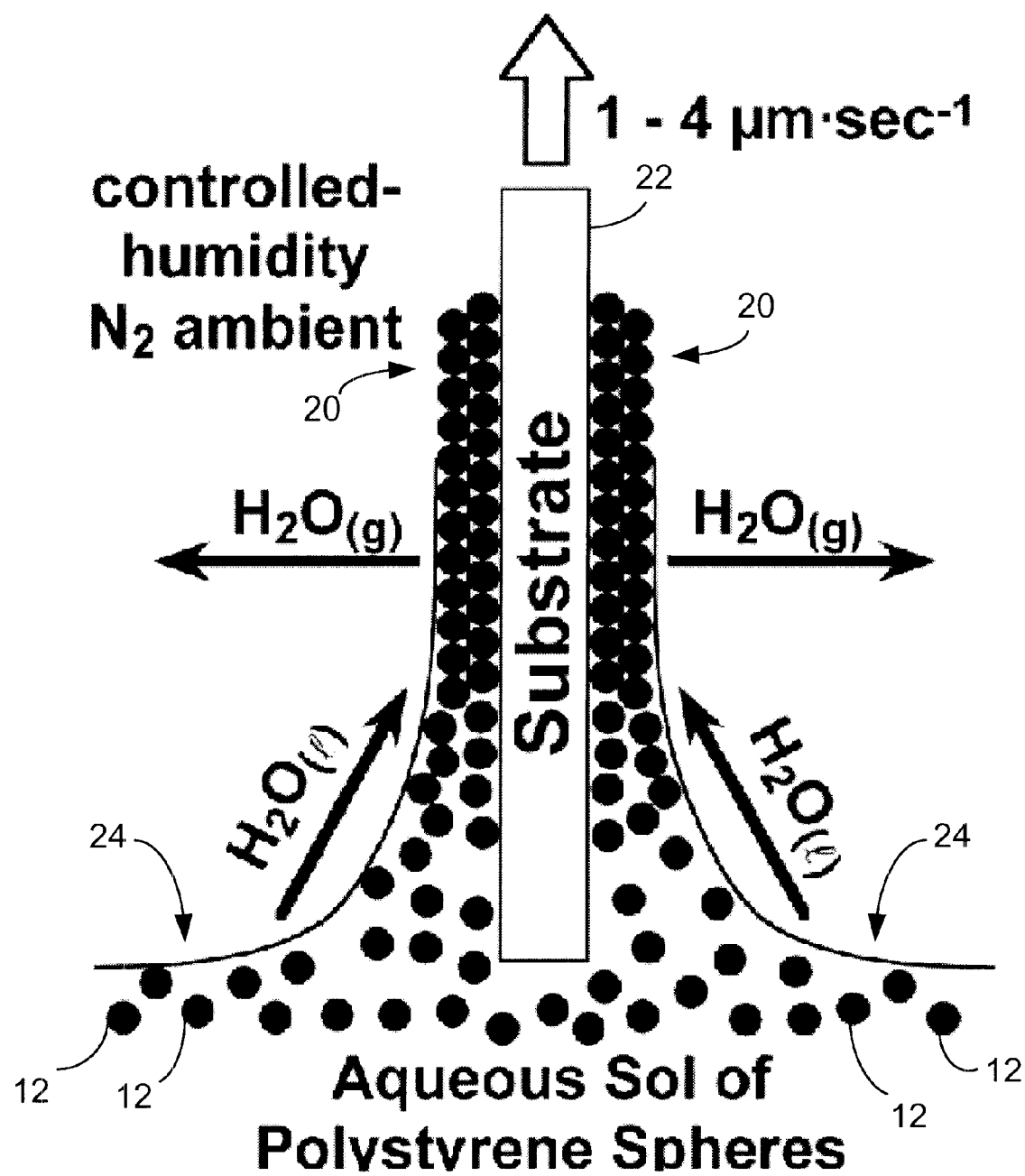
FIG. 2 is a diagram demonstrating a method for fabricating a natural lithographic mask of colloidal particles on a clean semiconductor surface (the substrate) by pulling the substrate vertically from a sol of colloidal particles.

FIG. 2 shows a fabrication method for a natural lithographic mask on a substrate 22. A two-dimensional colloid crystal 20 is grown on each side of the substrate 22 by vertically pulling the substrate 22 at a controlled speed from a sol 24 of spherical colloid particles 26. By careful control of the sol colloid concentration, pull speed, and ambient humidity, large areas of many mm² or more, of two-layer close-packed crystals can be grown. Monolayers and larger-area crystals can be obtained by modifying the crystal growth parameters, such as rate of pull speed, humidity, temperature, and sol concentration.

Figure 3:
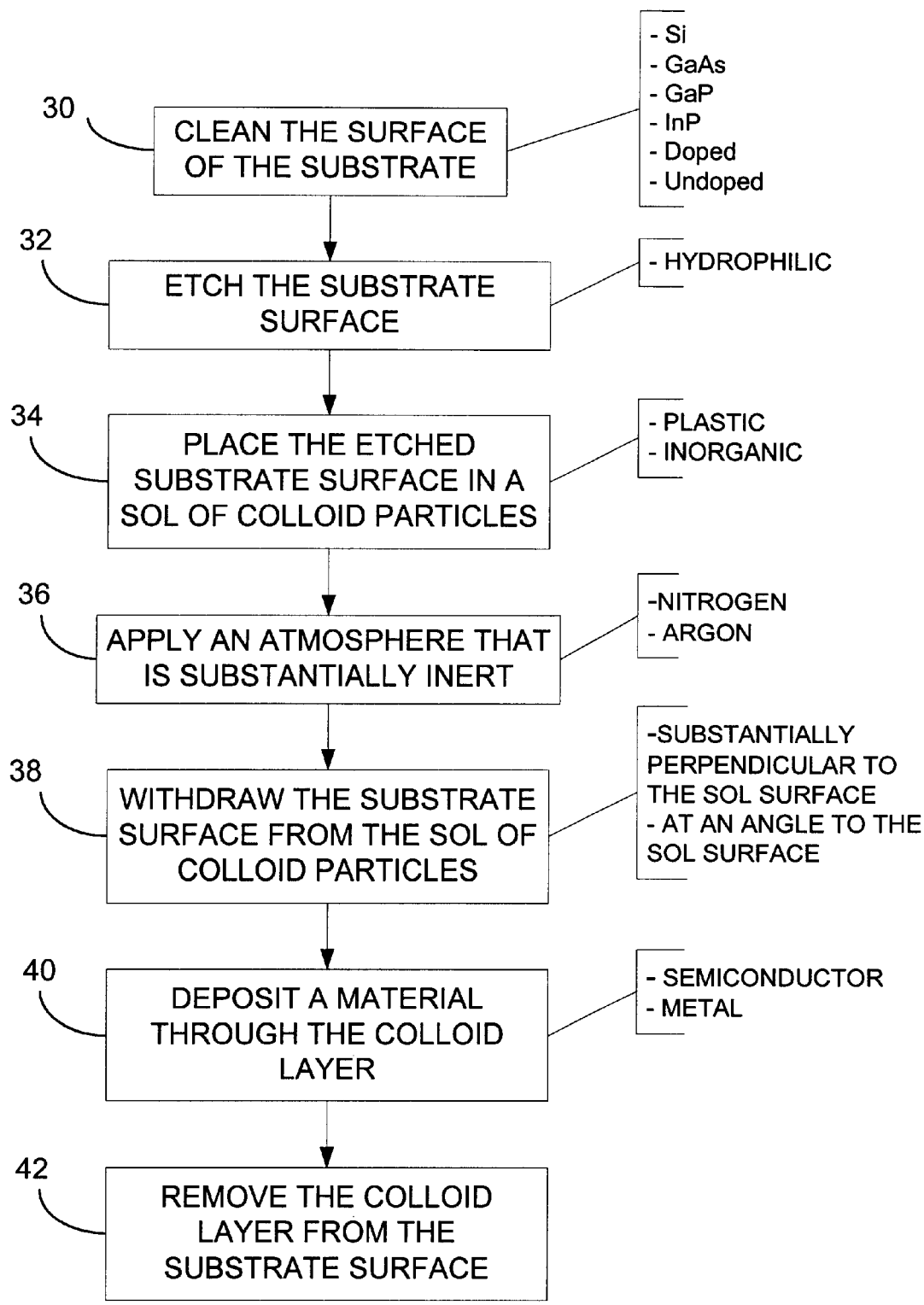
FIG. 3 is a flow diagram illustrating a method of producing arrays of features on a substrate in accordance with the teachings of the invention.

FIG. 3 shows a flow diagram of a method for forming a periodic array of nanoscale junctions in accordance with the teachings of the present invention. The method includes providing a semiconductor substrate with at least a portion of one clean surface or cleaning the surface of the substrate, block 30. Next at block 32, the clean substrate surface is made hydrophilic such as by etching the surface. Continuing on to block 34, hydrophilic surface is placed in a sol of colloid particles made from materials such as plastics and inorganic materials. An atmosphere that is substantially inert is applied at block 36. Gases such as nitrogen and argon are particularly advantageous. At block 38, a crystalline colloid monolayer or bilayer is formed on the substrate surface by withdrawing the substrate surface from the sol of colloid particles. The substrate surface is preferably oriented approximately perpendicular to the surface of the sol as the substrate is pulled from the sol. However, both the orientation of the substrate surface with respect to the sol surface and the direction of pulling the substrate surface from the sol encompass a range of angles from 0 to 180 degrees. Continuing to block 40, a metal or semiconductor material is deposited through the colloid layer onto the surface of the substrate forming a nanopattern thereupon. The size and spacing of the features on the substrate surface is a function of the size and arrangement of the colloidal particles used to form the crystalline mask. Finally at block 42, the colloid is removed from the semiconductor surface.

In another embodiment, a method for producing periodic arrays of nanometer-scale nickel contacts on a clean silicon surface, comprising the steps of: etching the silicon surface to make it hydrophilic; under an inert atmosphere, forming a crystalline colloid bilayer of spheres on the silicon surface by withdrawing the surface from an aqueous sol of colloid particles; evaporating nickel through the colloid layer onto the surface of the silicon; and removing the colloid from the silicon surface is provided.

The atmosphere present during the growth of the colloid layer is an inert atmosphere. As used herein, an "inert atmosphere" is substantially free of components which react with the surface on which the colloid layer is to be formed. In one embodiment, when the hydrophilicity of the surface requires the surface remain basic, the inert atmosphere is substantially free from carbon dioxide, as with Si. Oxygen (which oxidizes most moderate-gap semiconductors at an appreciable rate) and other gases capable of oxidizing the semiconductor surface must also be excluded. In a preferred embodiment, the atmosphere is an inert gas such as nitrogen or argon. Additionally, the temperature and humidity of the inert atmosphere may be controlled during the formation of the colloidal crystal on the substrate. In one embodiment, the typical values range from about 25% to about 40% relative humidity at about 22° C. In another embodiment, values of relative humidity down to about 10% are particularly suitable for a range of sphere sizes and surface conditions.

In one embodiment of the invention, the colloid particles can be made from any number of materials as long as the resulting particle can form a stable sol in water. The particles can be made from plastics or inorganic materials, such as $SiO_2$. In one embodiment, the surfaces of the particles are functionalized with chemical moieties or groups such as sulfate and carboxylate. In a preferred embodiment of the invention, the particles are spheres having a diameter ranging from about 30 to about 2500 nm. In a further preferred embodiment, the spheres used to form the crystalline array of particles are uniform in diameter to within a standard deviation in diameter on the order of about 1% of the average diameter of the particle. The sols used in an embodiment of the present invention are formed from about 1 to about 10% by weight of colloidal particles in water. The sol is free from dissolved carbon dioxide and carbonic acid species (carbonates).

The present invention is applicable to any semiconductor substrate that can be etched to provide an oxide-free hydrophilic surface that is stable in pure water, including, but not limited to, doped or undoped samples of many or all crystal orientations of silicon (Si), gallium arsenide (GaAs), gallium phosphide (GaP), and indium phosphide (InP).

In one embodiment of the invention, a periodic array of Ni-silicon junctions is formed on the surface of a P-doped, n-type (100) silicon sample. The silicon substrate is first cleaned and etched in a HF solution and a basic solution to make it hydrophilic, and then bilayers of same-sized close-packed latex spheres are deposited on n-Si. The spheres form a physical mask through which Ni is evaporated to produce regularly-spaced and -sized Si/Ni junctions. By varying the diameter of latex spheres from 174 nm to 1530 nm, geometrically self-similar triangular Si/Ni regions with approximately 100 to 800 nm edges, respectively, are produced.

Figure 4:
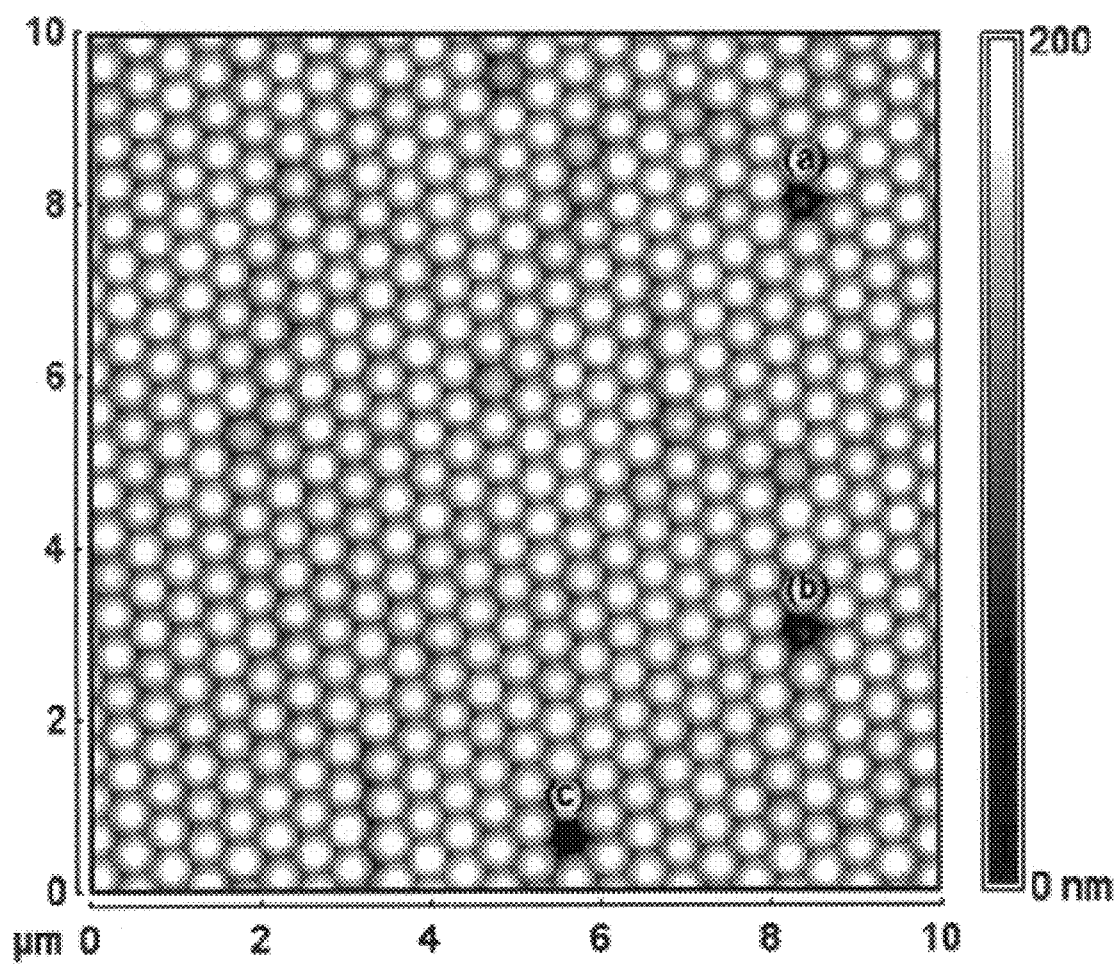
FIG. 4 is a tapping-mode atomic force microscopy (TMAFM) image of a two-layer (bilayer) crystal of 460 nm diameter polystyrene spheres grown on a n-silicon substrate.

FIG. 4 shows a tapping-mode atomic force microscopy (TMAFM) image of a bilayer crystal of 460 nm diameter polystyrene spheres grown on a n-Si substrate. Defective (undersized) spheres fill two of the point defects seen in the image (a and b), and a third point defect (c) is empty. The image was created using a Digital Instruments TESP probe in a Nanoscope III TMAFM system with a D scanner (imaging conditions: setpoint, 2.0V; free oscillation amplitude, 3.0V; 12 μm scan; 1 Hz scan rate; integral gain=0.591; proportional gain=5.45). The spheres in the lower layer (not visible) pack such that every other hole between the spheres is blocked by a sphere in the layer beneath. The remaining holes have a clear view down to the substrate, and it is these holes that define the metal or semiconductor patterns left on the substrate surface.

Figure 5:
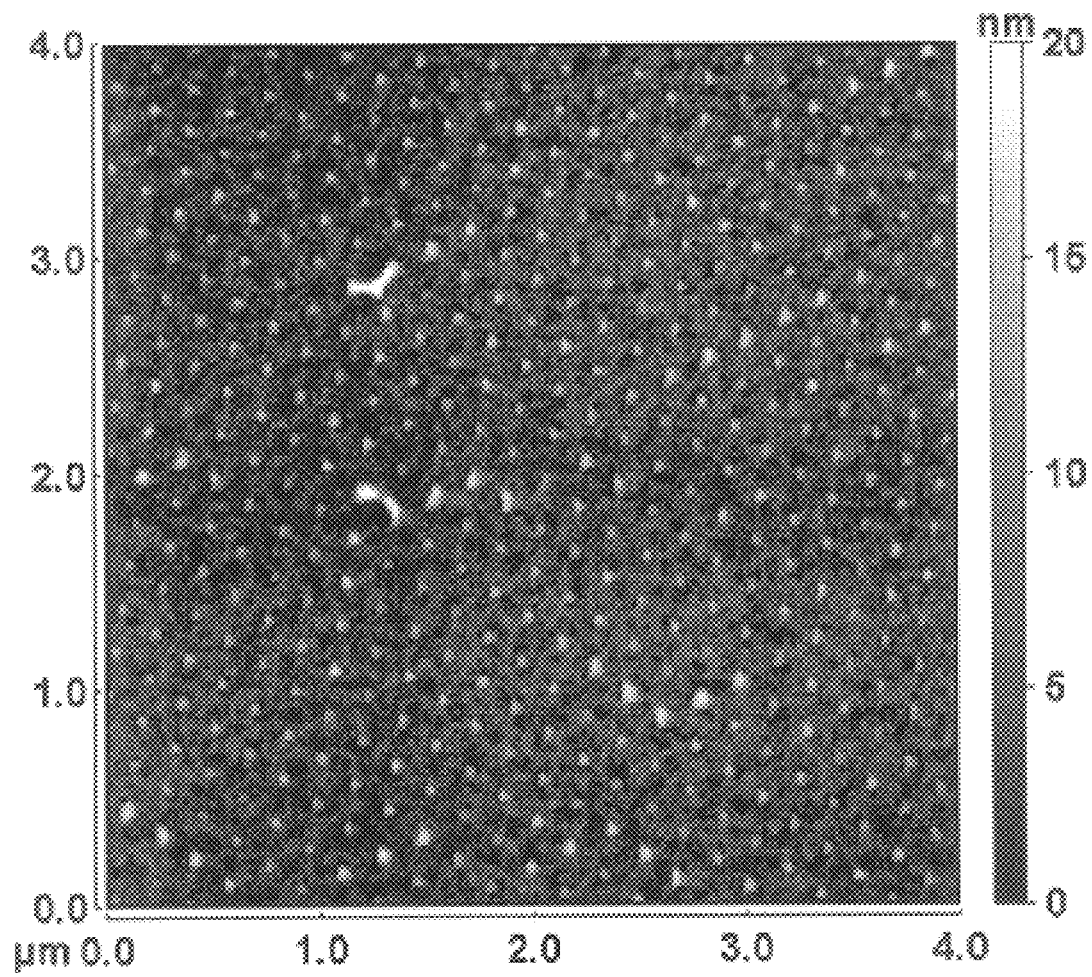
FIG. 5 shows a TMAFM image of a nickel pattern on a silicon surface created by evaporating nickel through a bilayer crystalline colloid mask composed of 174 nm diameter spheres.

FIG. 5 shows a TMAFM image of a nickel features on a silicon surface created from evaporation of nickel through a bilayer colloid mask composed of 174 nm diameter-spheres. The image was created using a Digital Instruments TESP probe in a Nanoscope III TMAFM system with an E scanner (imaging conditions: setpoint, 0.736V; free oscillation amplitude, 1.0V; scan size 4 $\mu$m; 1 Hz scan rate; integral gain=0.512; proportional gain=5.86). Point defects and dislocation defects present in the mask crystal are responsible for the defects in the nickel nanopattern seen on the silicon surface.

Figure 6:
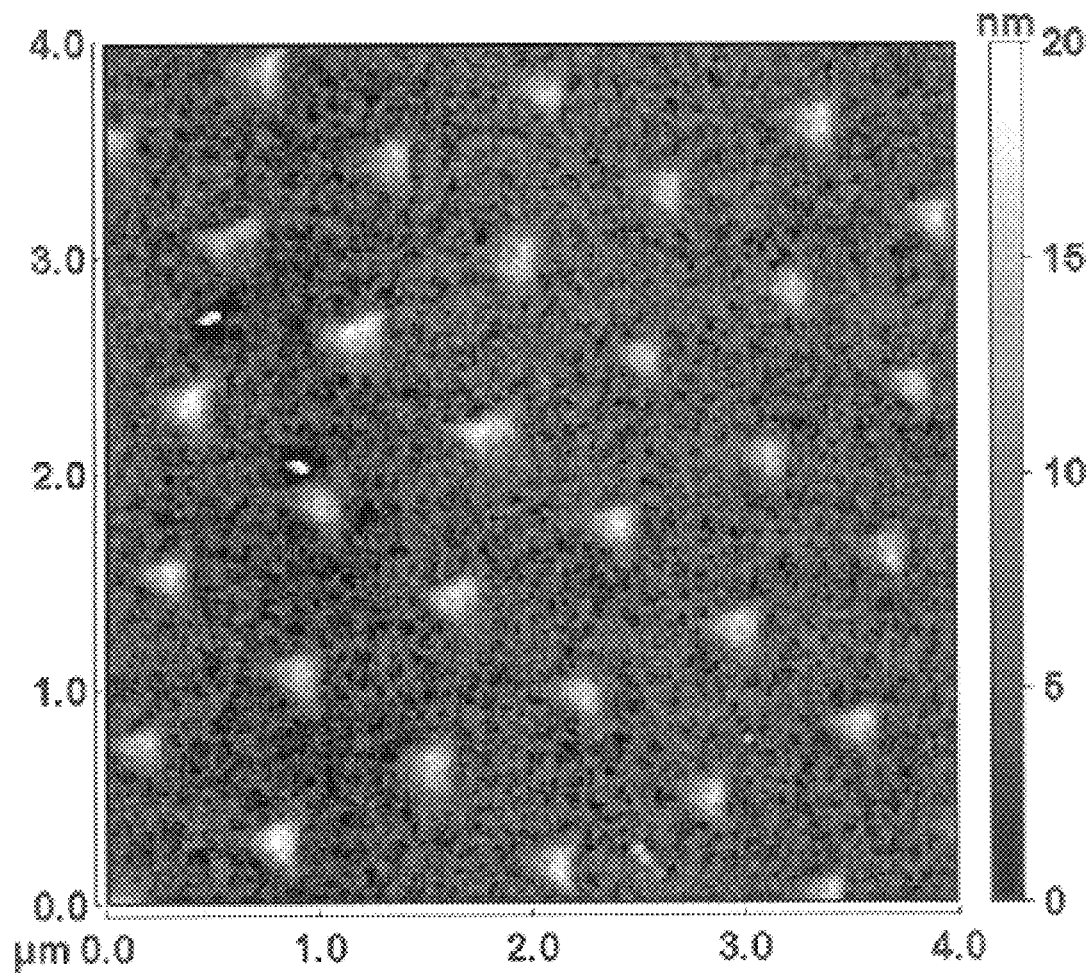
FIG. 6 is a TMAFM image of a nickel dot pattern on a silicon surface produced by metal deposition through a bilayer crystal mask composed of 760 nm diameter spheres.

FIG. 6 shows a TMAFM image of an array of nickel features on a silicon surface produced by metal deposition through a bilayer crystal mask composed of 760 nm diameter spheres. The image was created using a Digital Instruments TESP probe in a Nanoscope III TMAFM system with an E scanner (imaging conditions: setpoint, 0.304V; free oscillation amplitude, 0.5V; scan size, 4 $\mu$m; 1 Hz scan rate; integral gain=0.512; proportional gain=5.86).

EXAMPLE

To prepare an array of Ni-silicon junctions on a n-silicon (100) substrate, a P-doped silicon sample was first cleaned according to the following steps: the sample was sonicated in 18 M$\Omega$–cm water, then rinsed with the following solvents in the order listed: methanol, acetone, 1,1,1-tricholorethane, dichloromethane, again with 1,1,1-tricholorethane, acetone, methanol, and sonicated again in 18 M$\Omega$–cm water, and finally dried under a jet of high-pressure nitrogen or other inert gas. (The solvents used were ACS general reagent grade unless otherwise noted.) The degreased silicon sample was then etched in buffered semiconductor grade 49%wt HF(aq) (Transene flouride-bifluoride-hydroflouric acid buffer with stabilized HF activity) until the silicon surface was hydrophobic enough that droplets of the etchant readily rolled off its surface (about 30 seconds) and then etched with vigorous sonication in a saturated aqueous solution of semiconductor grade KOH at about 38° C. for 4 minutes. The etched silicon sample was then rinsed with 18 M$\Omega$–cm water. The rinse water was freshly purified and otherwise handled so as to prevent its acidification, which occurs most problematically through absorption of carbon dioxide gas from the atmosphere. The silicon sample was then blown dry under a high-pressure stream of nitrogen or other inert gas and submerged in a cell containing an aqueous sol of 10%wt mesoscale particles. The sol was protected from acidification caused by contact with carbon dioxide in the atmosphere. The mesoscale particles were 460 nm±4.8 nm diameter polystyrene beads (Seradyn #0.46 -OOPS-SSOO2L) selected for the monodispersity of their sphere diameters and functionalized with sulphate groups. Crystalline structures of latex spheres, close-packed in the plane parallel to the substrate surface and two sphere layers thick, were then produced using a procedure loosely analogous to Czochralski crystal growth, as detailed in FIG. 1. The humidity of the atmosphere was controlled by purging the crystal-growth chamber with dry nitrogen gas and ranged from 27 to 33% relative humidity at 22° C. The mask was pulled from the sol at speeds ranging from about 1 to about 4 $\mu$m./sec. FIG. 3 shows a tapping-mode atomic force microscopy image (TMAFM) of the surface of a two-layer crystal of 460 nm diameter polystyrene spheres on an n-Si substrate. A thin (15 to 50 nm) layer of 99.9994%wt Ni was then evaporated onto the silicon substrate coated with the latex spheres. The evaporation was performed in a Consolidated Vacuum Corp. thermal evaporation system under an ambient pressure of less than 1×10$^{-6}$ TORR. After Ni evaporation, the silicon substrate was sonicated in water to remove the colloid mask from its surface. FIG. 4 shows a TMAFM image of a Ni dot pattern left behind following evaporation through a two-layer crystal mask composed of 176 nm diameter spheres.

To prepare an array of Ni-silicon junctions on a n-GaAs (100) substrate, a Si-doped GaAs sample was first cleaned according to the following steps: the sample was sonicated in 18 M$\Omega$–cm water, then rinsed with the following solvents in the order listed: methanol, acetone, 1,1,1-tricholorethane, dichloromethane, again with 1,1,1-tricholorethane, acetone, methanol, and sonicated again in 18 M$\Omega$–cm water, and finally dried under a jet of high-pressure nitrogen or other inert gas. (The solvents used were ACS general reagent grade unless otherwise noted.) The degreased GaAs sample was then etched in 0.05% v/v Br in MeOH and then the excess Br removed from the surface by submersion in 2 M aqueous ammonia. This leaves the surface hydrophilic. Subsequent steps are as described above for Si.

The invention has been described and illustrated by exemplary and preferred embodiments, but is not limited thereto. Persons skilled in the art will appreciate that a variety of modification can be made without departing, from the scope of the invention, which is limited only by the claims.

What is claimed is:

1. A method for producing features on a surface of a substrate, comprising:

etching the substrate surface to make the surface hydrophilic;

in a substantially inert atmosphere, forming a crystalline colloid layer on the substrate surface;

depositing a material through the colloid layer onto the surface of the substrate; and removing the colloid from the substrate surface.

2. The method of claim 1, in which the material deposited through the colloid layer is selected from the group consisting of metals and semiconductors.

3. The method of claim 1 wherein the substrate is a semiconductor selected from the group consisting of silicon, gallium arsenide, gallium phosphide, and indium phosphide.

4. The method of claim 1 wherein forming the crystalline colloid layer includes withdrawing the substrate surface from a sol of colloid particles, the sol having a surface.

5. The method of claim 4 wherein the substrate surface is withdrawn from the sol in a direction substantially perpendicular to the surface of the sol.

6. The method of claim 4 wherein the sol is formed of particles having a diameter in the range of about 30 nm to about 2500 nm.

7. The method of claim 4 wherein the substrate surface is withdrawn from the sol such that the semiconductor surface and the surface of the sol form a non-perpendicular angle.

8. The method of claim 7 wherein the substrate is not rectangular.

9. The method of claim 1 wherein the atmosphere comprises a gas that is substantially free of components that react with the substrate surface.

10. The method of claim 9 wherein the gas is selected from nitrogen and argon.

11. The method of claim 1 wherein the crystalline colloid layer is selected from the group of mono-layer and bilayer.

12. The method of claim 1 wherein the crystalline colloid layer is made from a material that forms a stable sol in water.

13. The method of claim 12 wherein the crystalline colloid layer material is selected from the group of plastics and inorganics.

14. The method of claim 1 wherein a regular arrays of features are produced on the surface of the substrate.

15. A method for producing nanometer-scale nickel contacts on a silicon substrate surface, comprising:
- etching the silicon substrate surface such that the substrate surface becomes hydrophilic;
- placing the silicon substrate surface in an aqueous sol of colloid particles;
- applying an inert atmosphere while withdrawing the silicon substrate surface from the aqueous sol of colloid particles so that a crystalline colloid bilayer of spheres is formed on the silicon substrate surface;
- evaporating nickel through the crystalline colloid bilayer onto the silicon substrate surface; and
- removing the crystalline colloid bilayer from the silicon substrate surface.

16. The method of claim 15 further comprising cleaning the silicon substrate surface prior to etching.

17. The method of claim 15 wherein the inert atmosphere is substantially free of carbon dioxide.

18. The method of claim 15 wherein the colloid particles are spheres having a diameter ranging from about 30 to about 2500 nm.

19. The method of claim 18 wherein the colloid particles are approximately uniform in diameter to within about 1% of an average diameter of the particle.

20. The method of claim 15 wherein the substrate surface is withdrawn from the sol in a direction substantially perpendicular to a surface of the aqueous sol.

21. The method of claim 15 wherein a periodic array of nanometer-scale nickel contacts are formed on the silicon substrate surface.

22. A method for producing regular arrays of features on a surface of a semiconductor substrate, comprising:
- cleaning the silicon substrate surface;
- etching the cleaned substrate surface to make the surface hydrophilic;
- placing the silicon substrate surface in an aqueous sol of colloid particles, the aqueous sol having a surface;
- in a substantially inert atmosphere, withdrawing the silicon substrate surface from the aqueous sol of colloid particles in a direction that is substantially perpendicular to the surface of the sol, so that a crystalline colloid layer is formed on the silicon substrate surface;
- depositing a material through the colloid layer onto the surface of the substrate; and
- removing the colloid from the substrate surface.

23. The method of claim 22 wherein the semiconductor substrate is selected from the group consisting of doped and undoped types of silicon, gallium arsenide, gallium phosphide, and indium phosphide.

24. The method of claim 22, wherein the material deposited through the colloid layer is selected from the group consisting of metals and semiconductors.

25. The method of claim 22 wherein the crystalline colloid layer is formed from a material selected from the group of plastics and inorganics.

26. The method of claim 22 wherein the inert atmosphere has a relative humidity of about 10% to about 40%.

27. The method of claim 22 wherein the inert atmosphere has a relative humidity of at least about 10%.

* * * * *